(12) United States Patent
Bolognia et al.

(10) Patent No.: US 9,870,967 B2
(45) Date of Patent: Jan. 16, 2018

(54) PLURALITY OF SEALS FOR INTEGRATED DEVICE PACKAGE

(71) Applicant: ANALOG DEVICES, INC., Norwood, MA (US)

(72) Inventors: David Bolognia, Charlestown, MA (US); Jingwen Zhu, Andover, MD (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/066,397

(22) Filed: Mar. 10, 2016

(65) Prior Publication Data

US 2017/0263515 A1 Sep. 14, 2017

(51) Int. Cl.
| | |
|---|---|
| *H01L 23/12* | (2006.01) |
| *H01L 21/00* | (2006.01) |
| *H01L 23/053* | (2006.01) |
| *H01L 23/16* | (2006.01) |
| *H01L 23/00* | (2006.01) |
| *H01L 23/10* | (2006.01) |

(52) U.S. Cl.
CPC ............ *H01L 23/053* (2013.01); *H01L 23/10* (2013.01); *H01L 23/16* (2013.01); *H01L 24/06* (2013.01)

(58) Field of Classification Search
CPC ....... H01L 23/10; H01L 23/053; H01L 24/06; H01L 23/16
See application file for complete search history.

(56) References Cited

U.S. PATENT DOCUMENTS

| 3,735,211 | A | * | 5/1973 | Kapnias | ................ | H01L 23/055 |
|---|---|---|---|---|---|---|
| | | | | | | 156/281 |
| 4,633,573 | A | | 1/1987 | Scherer | | |
| 5,881,944 | A | * | 3/1999 | Edwards | ............ | B23K 35/0238 |
| | | | | | | 228/56.3 |
| 6,294,408 | B1 | * | 9/2001 | Edwards | ................ | H01L 23/10 |
| | | | | | | 257/E23.087 |
| 7,187,077 | B1 | * | 3/2007 | Nagarajan | ............... | H01L 21/50 |
| | | | | | | 257/678 |
| 7,275,432 | B2 | * | 10/2007 | Yamaguchi | ......... | B81C 1/00269 |
| | | | | | | 257/704 |
| 7,833,839 | B1 | * | 11/2010 | Touzelbaev | ............. | H01L 23/42 |
| | | | | | | 257/706 |
| 8,383,462 | B2 | * | 2/2013 | Loiselet | ................ | H01L 23/053 |
| | | | | | | 257/704 |
| 8,900,927 | B2 | * | 12/2014 | Beaumier | ............... | H01L 23/10 |
| | | | | | | 165/80.3 |
| 2011/0127655 | A1 | * | 6/2011 | Fujii | ..................... | H01L 23/055 |
| | | | | | | 257/664 |

(Continued)

*Primary Examiner* — Alonzo Chambliss
(74) *Attorney, Agent, or Firm* — Knobbe, Martens, Olson & Bear, LLP (57) ABSTRACT

Semiconductor packages and methods of manufacturing semiconductor packages are described herein. In certain embodiments, the semiconductor package includes a substrate, a wall attached to the substrate, a first adhesive layer disposed between a bottom surface of the wall and a top surface of the substrate, and a second adhesive layer disposed around an outer perimeter of the first adhesive layer, the second adhesive layer disposed adjacent and contacting the wall, the second adhesive layer different from the first adhesive layer, wherein at least one of the first adhesive layer and the second adhesive layer connects the wall to electrical ground.

19 Claims, 7 Drawing Sheets

(56) References Cited

U.S. PATENT DOCUMENTS

| | | | |
|---|---|---|---|
| 2012/0139111 A1* | 6/2012 | Ono | H01L 23/055 257/741 |
| 2013/0052775 A1* | 2/2013 | Kim | H01L 23/552 438/118 |
| 2014/0239477 A1* | 8/2014 | Kim | H01L 23/552 257/692 |
| 2015/0303173 A1* | 10/2015 | Maydar | H01L 23/49827 257/664 |

* cited by examiner

PLURALITY OF SEALS FOR INTEGRATED DEVICE PACKAGE

BACKGROUND

Field

The present disclosure relates generally to a seal for a semiconductor package, and manufacturing methods therefor.

Description of the Related Art

Hermetic or near hermetic seals may be used to seal semiconductor packages to protect the package from damage due to moisture. Such seals may be used, for example, to inhibit moisture from permeating into the package and damaging the integrated device die(s) inside the package, thereby maintaining the performance of and/or increasing the longevity of the integrated device die(s). For example, hermetic or near hermetic seals may be used in high frequency integrated device die applications in which the die is disposed in an air cavity. The seal can prevent or reduce the risk of temperature- and/or humidity-based failures that might otherwise result if moisture were allowed to seep into the package.

However, typical hermetic or near hermetic seals can be expensive (e.g., when used with packages having ceramic substrates), may leave flux residue inside the package (e.g., for solder-based seals), and/or may not ground the package lid to the substrate. Accordingly, a continuing need exists for improved seals for cavity packages.

SUMMARY OF SOME EMBODIMENTS

The systems, methods, and devices described herein each have several aspects, no single one of which is solely responsible for its desirable attributes. Without limiting the scope of this invention as expressed by the claims which follow, some features are described briefly below. After considering this description, and particularly after reading the section entitled "Detailed Description of Some Embodiments," one will understand the advantageous features of the systems, methods, and devices described herein.

In some aspects, a semiconductor package including a first and a second adhesive layer is disclosed. The semiconductor package can include a substrate, a wall attached to the substrate, a first adhesive layer disposed between a bottom surface of the wall and a top surface of the substrate, and a second adhesive layer disposed around an outer perimeter of the first adhesive layer. The second adhesive layer can be disposed adjacent and contacting the wall. The second adhesive layer can be different from the first adhesive layer and at least one of the first adhesive layer and the second adhesive layer can connect the wall to electrical ground.

In some aspects, a semiconductor package including a first and a second epoxy layer is disclosed. The semiconductor package can include a substrate, a wall attached to the substrate, a first epoxy layer disposed between a bottom surface of the wall and a top surface of the substrate, and a second epoxy layer disposed around an outer perimeter of the first epoxy layer. The second epoxy layer can be disposed adjacent and contacting the wall.

In some aspects, a semiconductor package including an epoxy layer and a solder layer is disclosed. The semiconductor package can include a substrate, a wall attached to the substrate, an epoxy layer disposed between a bottom surface of the wall and a top surface of the substrate, and a solder layer disposed around an outer perimeter of the epoxy layer. The solder layer can be disposed adjacent and contacting the wall. The epoxy or solder layer can connect the wall to electrical ground.

Details of one or more embodiments of the subject matter described in this application are set forth in the accompanying drawings and the description below. Any of the features, components, or details of any of the arrangements or embodiments disclosed in this application are combinable and modifiable to form myriad new arrangements and embodiments that fall within the spirit and scope of this disclosure. Other features, aspects, and advantages will also become apparent from the description, the drawings, and the claims. Note that the relative dimensions of the following figures may not be drawn to scale.

BRIEF DESCRIPTION OF THE DRAWINGS

Embodiments will now be described with reference to the following drawings, which are provided by way of example, and not limitation. Like reference numerals indicate identical or functionally similar elements.

DETAILED DESCRIPTION OF SOME EMBODIMENTS

Embodiments of the present disclosure provide seals for semiconductor packages to protect the packages from damage due to moisture. In particular, the present disclosure relates to seals which include at least two adhesives for sealing a package lid to a package substrate. For example, in various embodiments, the seal can include a first epoxy seal and a second epoxy seal disposed about a perimeter of the lid and/or the first epoxy seal. In other embodiments, the seal can comprise an epoxy seal and a solder seal disposed about the periphery of the epoxy seal. Various embodiments also illustrate example methods of manufacturing the packages with such seals. While certain embodiments are described below, these embodiments are presented by way of example only, and can be embodied in different ways as defined and covered by the claims.

Figure 1A:
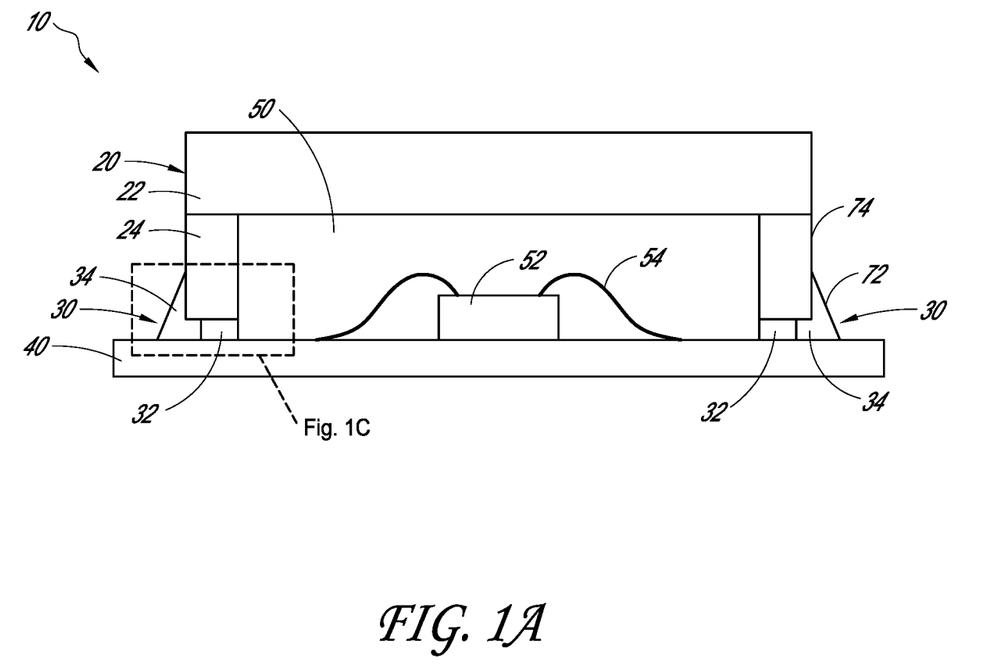
FIG. 1A is a schematic side sectional view of a semiconductor package with a seal having at least two adhesives, in accordance with one embodiment.

FIG. 1A is a schematic side sectional view of a semiconductor package 10 with a seal comprising at least two adhesives, according to one embodiment. In the illustrated embodiment, the semiconductor package 10 includes a lid 20, a seal 30, and a substrate 40. The lid 20 can be flat or shaped to define a concavity. In the embodiment of FIG. 1A, for example, the lid 20 is shaped such that it cooperates with the substrate 40 to define a cavity 50. In other embodiments, however, the lid 20 may comprise a flat lid, which can be disposed over a recess in a substrate to define the cavity (not illustrated). The lid 20 can include a cover 22 and a wall 24 which extends around the periphery of the cover 22. In certain embodiments, the top surface of the wall 24 can be attached to the bottom surface of the cover 22, for example, by way of an adhesive, a weld, or other type of joint. In the illustrated embodiment, however, the cover 22 and wall 24 are integrally formed as a single component.

As shown in FIG. 1A, the underside of the wall 24 can be attached to the substrate 40 via the seal 30. It should be appreciated that the cover 22 and the wall 24 can have any suitable shape, can take any suitable form, and can be any suitable material. For example, in certain embodiments, the lid 20 can comprise a metal and/or a composite material. In some embodiments, the lid 20 can comprise a plastic lid (e.g., liquid crystal polymer or LCP) plated with a metal, such as Ni, NiAu alloys, or any other suitable metals. Similarly, the substrate 40 of FIG. 1A can take on any suitable shape and/or material. For example, in some embodiments, the substrate 40 can comprise a flexible substrate, a printed circuit board (PCB) substrate, a leadframe, a ceramic substrate, or a plastic substrate (for example, liquid crystal polymer).

As illustrated in FIG. 1A, the lid 20 and the substrate 40 cooperate to define the cavity 50, which can be filled with a gas such as air. An integrated device die 52 can be disposed in the cavity 50. For example, the integrated device die 52 can be mounted to the top surface of the substrate 40 with an adhesive. Of course, it should be appreciated that multiple integrated device dies 52 can be disposed in the cavity 50, even though only one die 52 is illustrated in FIG. 1A. In the illustrated embodiment, the cavity 50 is defined by the cover 22, the wall 24, the substrate 40, and the seal 30. The integrated device die 52 can be any suitable die for any suitable application. For example, in various embodiments, the integrated device die 52 can comprise a gallium arsenide (GaAs) die, a gallium nitride (GaN) die, a silicon die, or any other suitable Group III-V semiconductor die. The integrated device die 52 disposed in the cavity 50 can be designed for high frequency applications, such as, for example, high speed fiber optic applications, high frequency military applications, communications infrastructure (e.g., point-to-point communication in the E-frequency band), cellphone backbones, radars, and the like.

As further illustrated in FIG. 1A, bond wires 54 can provide an electrical connection between the integrated device die 52 and the substrate 40. In other embodiments, flip-chip connection, through silicon vias and solder bumps, or other electrical interconnection methods may be used in lieu of bond wires to electrically connect the integrated device die 52 to the substrate 40. In various embodiments, the semiconductor package shown in FIG. 1A can take on different arrangements without departing from the spirit and scope of this disclosure.

In some embodiments, such as high frequency packages which incorporate an air cavity over the die 52, it can be important to prevent moisture from damaging the die 52 and/or other components of the package 10. Some packaging techniques may employ a conventional, full hermetic seal. However, full, hermetically-sealed packages are expensive to assemble and larger than desired. In some arrangements that employ a near-hermetic seal, the lid 20 can be attached to the substrate 40 with a solder joint to prevent moisture from entering the cavity 50 and damaging the die 52. However, the use of solder to attach the lid 20 to the substrate 40 may leave flux residue in the cavity 50 and/or on the die 52, which can damage the die 52. In other arrangements, epoxy may be used to attach the lid 20 to the substrate 40. However, epoxy may be permeable to moisture such that the epoxy does not protect the die 52 from damage due to moisture. Accordingly, there remains a continuing need for improved seals for attaching a package lid to a substrate for various types of cavity packages.

Advantageously, in the embodiment of FIG. 1A, the lid 20 can be attached to the substrate 40 via the seal 30, which can prevent moisture and solder flux from damaging the die 52, while providing a secure mechanical connection between the lid 20 and substrate 40. As explained herein, the seal 30 can also advantageously connect the lid 20 to electrical ground, e.g., by way of connection to one or more ground bond pads on the substrate 40. The seal 30 of FIG. 1A includes a first adhesive layer 32 and a second adhesive layer 34 disposed about the first layer 32. Together, the first and second adhesive layers 32, 34 can seal the lid 20 to the substrate 40. It should be appreciated that, although two adhesive layers are provided in FIG. 1A, in other embodiments, more than two adhesive layers may be applied to further improve the seal 30. As shown in FIG. 1A, the seal 30 can be positioned at an interface between the lid 20 and the substrate 40. For example, the first adhesive layer 32 can be disposed between a bottom surface of the wall 24 and a top surface of the substrate 40, such as the seal 30 shown in FIG. 1A. A portion of the second adhesive layer 34 can be disposed between a bottom surface of the wall 24 and a top surface of the substrate 40, and another portion of the second adhesive layer 34 can extend outside the package to form an outer exposed fillet 72. The outer fillet 72 can extend beyond an outer side surface 74 of the wall 24, as shown in FIG. 1A. This outer fillet 72 may or may not contact an outer side surface 74 of the wall. In the embodiment of FIG. 1A, for example, the outer fillet 72 may contact the outer side surface 74 to enhance the adhesion of the lid 20 to the second adhesive layer 34.

Figure 1B:
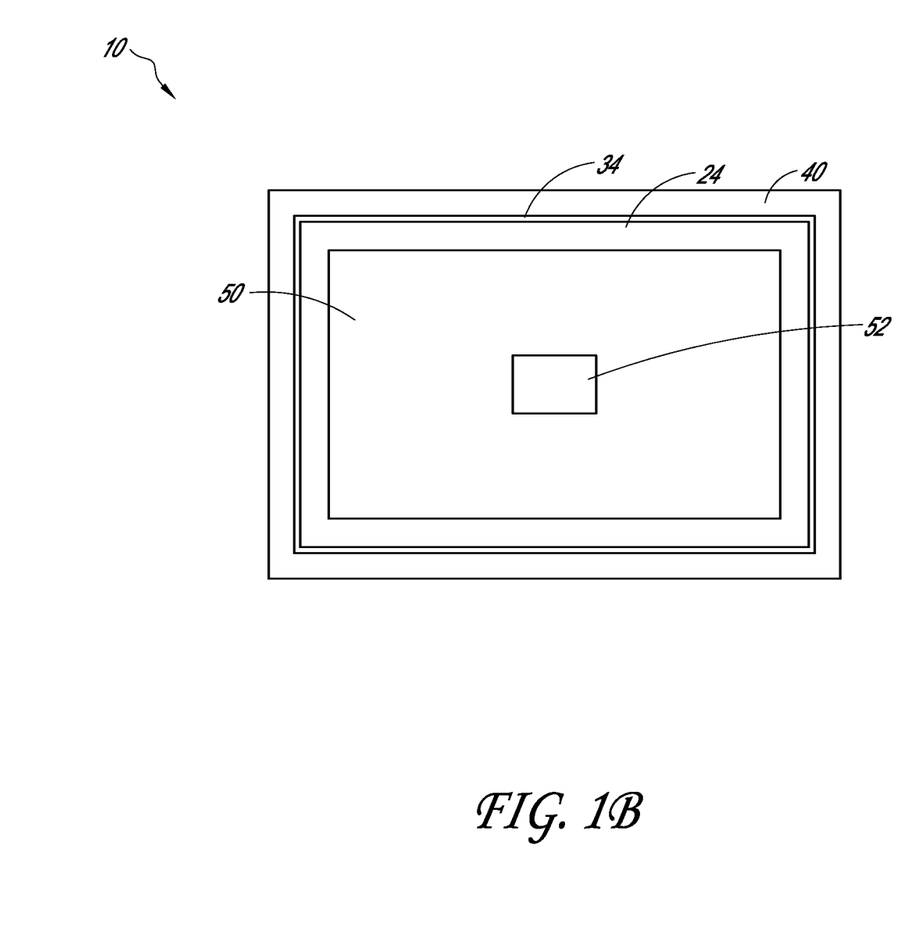
FIG. 1B is a schematic top plan view of the semiconductor package of FIG. 1A, with the cover omitted for purposes of illustration.
Figure 1C:
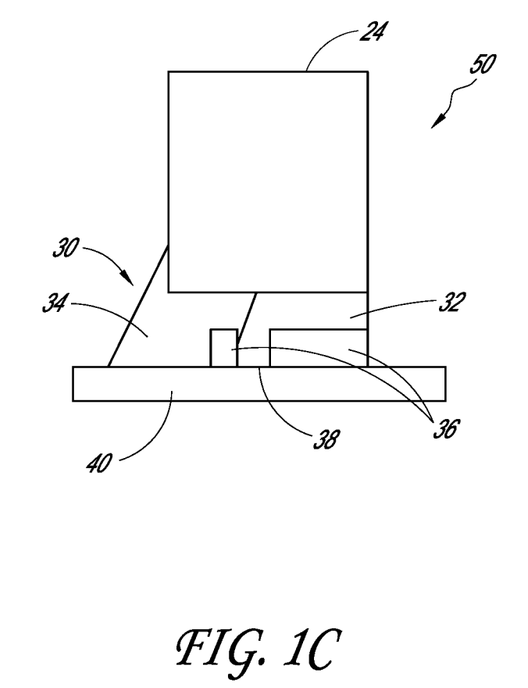
FIG. 1C is a magnified partial side sectional view of the package of FIG. 1A which illustrates the seal between the wall and the substrate.

FIG. 1B is a schematic top plan view of the semiconductor package 10 of FIG. 1A, with the cover omitted for purposes of illustration. FIG. 1C is a magnified partial side sectional view of the package 10 of FIG. 1A which illustrates the seal 30 between the wall 24 and the substrate 40. As shown in FIGS. 1B-1C, the second adhesive layer 34 can extend beyond the interface between the wall 24 and the substrate 40 and into the region that surrounds the outer side surface 74 of the wall 24, thereby forming the exposed outer fillet 72. As shown in FIGS. 1A-1C, the second adhesive layer 34 can comprise a closed annulus that completely surrounds the outer perimeter of the first adhesive layer 32 so as to provide a seal around the first adhesive layer 32. Similarly, the first adhesive layer 32 can also comprise a closed annulus that completely surrounds the cavity 50. In various embodiments, the first adhesive layer 32 and the second adhesive layer 34 can cooperate to prevent moisture and other debris from entering the cavity 50 and damaging the die 52. The first and second adhesives 32, 34 can also provide a secure mechanical and electrical connection to the substrate 40.

Returning to FIG. 1A, the first and second adhesive layers 32, 34 are shown contacting each other between the wall 24 and the substrate 40. In some embodiments, a portion of an inner perimeter of the second adhesive layer 34 can contact a portion of an outer perimeter of the first adhesive layer 32 at a location between the substrate 40 and a bottom surface of the wall 24. However, it should be appreciated that the first and second adhesive layers 32, 34 can additionally or alternatively make contact adjacent or proximate the interface between the wall 24 and the substrate 40. It should also be appreciated that the first and second adhesive layers 32, 34 need not contact each other in some arrangements. For example, in certain embodiments, the first and second adhesive layers 32, 34 can be spaced apart with a gap, or can be spaced apart with an intervening insulator or dielectric material. The first and second adhesive layers 32, 34 may or may not contact intervening material which spaces the layers apart.

The particular way in which the first and second adhesive layers 32, 34 of the seal 30 are disposed at the interface between the wall 24 and the substrate 40 can depend on various factors, including the material composition of the first and second adhesive layers 32, 34. For example, in various embodiments, the first adhesive layer 32 can comprise epoxy and the second adhesive layer 34 can comprise epoxy or solder. The first and second adhesives 32, 34 of the seal 30 can have differing yet complementary functions. For example, the first adhesive layer 32 can be selected to provide secure attachment of the lid 20 to the substrate 40 and to provide a mechanical barrier to preventing debris (such as solder flux residue) from entering the cavity 50 and damaging the die 52. The second adhesive 34 can be selected to prevent moisture and debris from entering the cavity 50 and damaging the die 52. In various embodiments, one or both of the first and second adhesive layers 32, 34 can connect the lid 20 to electrical ground to cause the lid 20 to act as a radio frequency (RF) shield.

For example, in one embodiment, the first adhesive 32 can comprise an epoxy and the second adhesive 34 can comprise solder. In such an embodiment, the epoxy of the first layer 32 can prevent debris or residue from the soldering process from contaminating the cavity 50, such as, for example, solder flux residue. Without the epoxy seal of the first adhesive layer 32, residue from the soldering process may otherwise contaminate the cavity 50 and impair or decrease the performance of the integrated device die 52. Moreover, the solder of the second adhesive 34 can advantageously act as a barrier to moisture that may otherwise pass through the permeable epoxy of the first adhesive layer 32. Thus, when the first adhesive 32 comprises an epoxy and the second adhesive 34 comprises solder, the epoxy can protect the cavity 50 and die 52 from solder residue, while the solder prevents moisture from migrating through the epoxy to the cavity 50 and die 52. As explained herein, one or both of the first and second adhesive layers 32, 34 can electrically connect the lid 20 to electrical ground. For example, in some embodiments, only the second adhesive 34 (e.g., solder) may connect to ground, while in other embodiments, only the first adhesive 32 (e.g., epoxy) may connect to ground. In still other embodiments, both the first adhesive 32 (e.g., epoxy) and the second adhesive 34 (e.g., solder) may connect to ground. In embodiments in which an epoxy connects the lid 20 to ground, the epoxy can comprise a conductive epoxy so as to complete the electrical connection to the bond pads of the substrate 40. In addition to these functions, the first and second adhesive layers 32, 34 can provide structural support to the semiconductor package 10. For example, the first and second adhesive layers 32, 34 can support the lid 20 and resist larger lateral forces when the inner and outer fillets 70, 72 described above are employed.

Thus, the quality of the seal 30 of the semiconductor package 10 may depend on the material composition of the first and second adhesive layers 32, 34, as well as on the materials of the lid 20 and the substrate 40. Advantageously, various embodiments disclosed herein may enable a seal 30 that is air and/or watertight. In some embodiments, the seal 30 may be, able to withstand without failure standard temperature humidity bias (THB) testing at 85 degrees Celsius and 85% humidity in the range of 1000 hours to 3000 hours, more than 1000 hours, more than 1300 hours, more than 1700 hours, more than 2000 hours, more than 2500 hours, less than 3000 hours, less than 2800 hours, less than 2600 hours, less than 2100 hours, less than 1500 hours, or any other suitable range. For example, in certain embodiments, the seal 30 can be able to withstand standard THB test at 85 degrees Celsius and 85% humidity for at least 1000 hours, at least 1008 hours, at least 1100 hours, at least 1200 hours, at least 1300 hours, at least 1400 hours, at least 1500 hours, at least 1600 hours, at least 1700 hours, at least 1800 hours, at least 1900 hours, at least 2000 hours, at least 2100 hours, at least 2200 hours, at least 2300 hours, at least 2400 hours, at least 2500 hours, at least 2600 hours, at least 2700 hours, at least 2800 hours, at least 2900 hours, or at least 3000 hours.

As described above, the first or second adhesive layer 32, 34 can electrically ground the lid 20 to the substrate 40. For example, in certain embodiments, solder or another conductive adhesive connects the lid 20 to electrical ground. In other embodiments, the first or second adhesive layer 32, 34 can comprise an epoxy with a conductive filling that electrically grounds the lid 20. For example, the conductive filling can transfer electrical signals through the epoxy to the substrate 40 and can comprise silver and/or copper, among other materials.

Further, as also described above, the first and second adhesive layers 32, 34 can have the same general material composition, such as, for example, epoxy and epoxy, or can have a different general material composition, such as, for example, epoxy and solder. There are advantages to both types of seals. For example, seals which have solder as one of the layers may advantageously be more immune to moisture ingress into the package relative to seals which have two epoxy layers, since solder is a comparatively denser material. As another example, seals which have epoxy as both of the layers can advantageously reduce the amount of thermal stress to the package since epoxy sets at a lower temperature relative to solder. Thus, using seals that include two epoxy layers can be beneficial for subsequent downstream thermal processes. In embodiments where the general composition of both the first and second adhesive layers 32, 34 is epoxy, the first adhesive layer 32 can be a conductive epoxy (e.g., a silver filled and/or copper filled epoxy) and the second adhesive layer 34 can be a non-conductive epoxy (e.g., a non-conductive encapsulant, a glob top material impermeable to moisture, a thermal cured epoxy, and the like), although any suitable epoxy is appreciated. The epoxy used for the first and second adhesive layer 32, 34, can have complementary material properties which advantageously cooperate to result in the seals described herein. For example, the second adhesive layer 34 can be more effective at inhibiting moisture from permeating into the package than the first adhesive layer 32, and the second adhesive layer 34 can be thicker and/or denser than the first adhesive layer 32, or vice versa. As another example, in some embodiments, the first adhesive layer 32 can form a conductive seal that grounds the lid 20 to the substrate 40 to complete, for example, a Faraday cage which shields the package 10 from electromagnetic interference, and the second adhesive layer 34 can form a structural seal that inhibits moisture from permeating into the package through the seal 30.

Turning to FIG. 1C, the semiconductor package 10 can also include a solder mask dam 36 positioned on the substrate proximate the wall 24. For example, FIG. 1C illustrates a solder mask dam 36 disposed on the substrate 40 beneath a bottom surface of the wall 24. Although not shown in the figures, the solder mask dam 36 can form a closed annulus around a perimeter of the cavity 50 near the interface between the wall 24 and substrate 40, or can be positioned at one or more locations along a path defined by a perimeter proximate the interface between the wall 24 and substrate 40. In various embodiments, the solder mask dam can comprise a dielectric material. For example, the solder mask dam can include an epoxy based material (e.g., a petrochemical based material formed in sheets), or any other suitable insulator or dielectric material. A portion of the first and second adhesive layers 32, 34 can be adhered to the solder mask dam 36, which can advantageously insulate the adhered adhesive layer 32, 34 from portions of the substrate 40 that are not intended to electrically communicate with the lid 20 by way of the adhesives 32, 34. In addition, the solder mask dam 36 can advantageously enhance the wettability of the second adhesive 34 (e.g., solder) to the lid 20 and the substrate 40 by preventing or reducing contaminants from the first adhesive 32 from reaching the area to which the second adhesive 34 is to be applied. Further, as shown in FIG. 1C, both segments of the solder mask dam 36 can be disposed under the wall 24 of the lid 20 such that the lid 20 overlaps the dam 36. Such an overlap can advantageously enhance the wettability of the second adhesive (e.g., solder) and/or compensate for lateral lid displacement.

As shown in FIG. 1C, a gap 38 can be formed between two or more segments of the solder mask dam 36. In various embodiments, a portion of the substrate 40 is exposed in the gap 38. The portion of the substrate 40 that is exposed can have conductive traces, such as, for example, metal traces of a leadframe. In certain embodiments, a portion of the first or second adhesive layer 32, 34 can be disposed within the gap such that it contacts and/or is connected the conductive traces exposed therein. Such an arrangement can advantageously electrically ground the lid 20 by way of the first and/or second adhesive layers 32, 34. In certain embodiments, the first adhesive layer 32 can contact both segments of the solder mask dam 36 in addition contacting and/or connecting to the conductive traces of the substrate 40 exposed in the gap 38. Similarly, in certain embodiments, the second adhesive layer 34 can contact both segments of the solder mask dam 36 in addition contacting and/or connecting to the conductive traces of the substrate 40 exposed in the gap 38. Of course, additional arrangements may also be suitable, such as, for example, arrangements in which the first the first and second layers 32, 34 are spaced apart with a gap, or are spaced apart with an intervening insulator or dielectric material, which the first and second adhesive layer 32, 34 may or may not contact.

Figure 2A:
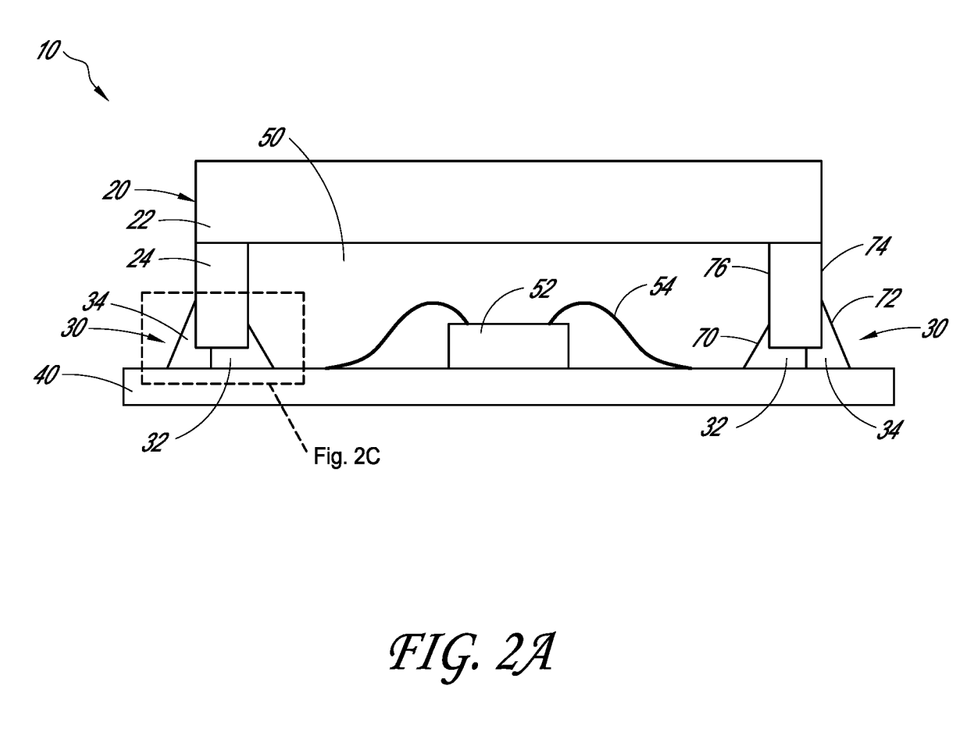
FIG. 2A is a schematic side cross-sectional view of a semiconductor package with a seal having an inner fillet, according to another embodiment.
Figure 2B:
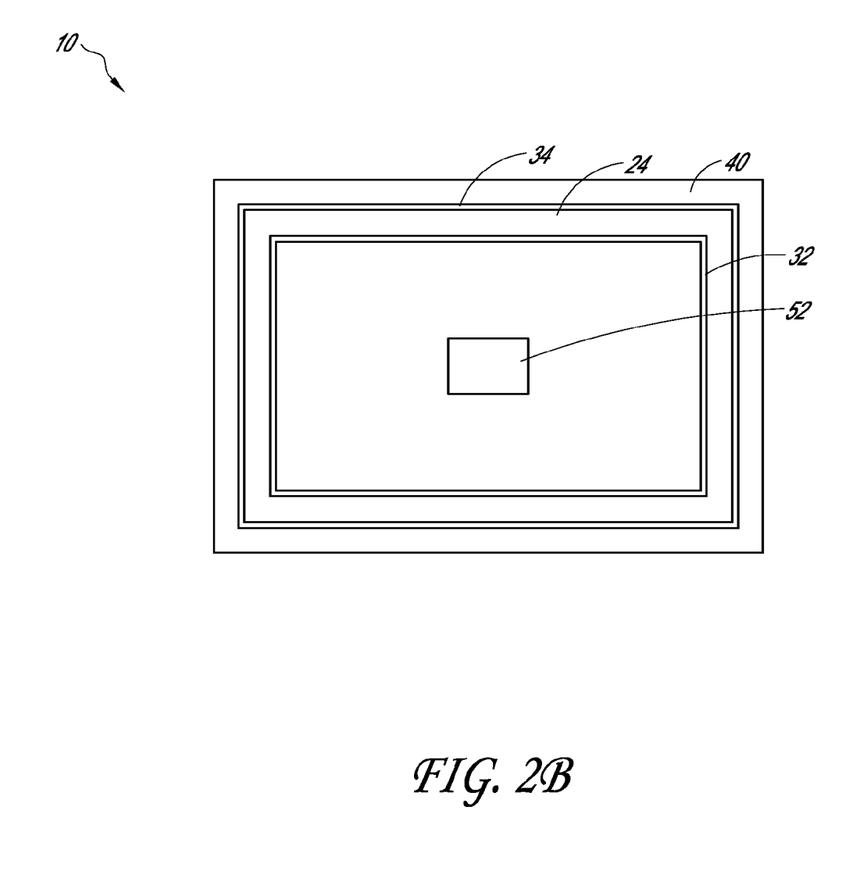
FIG. 2B is a schematic top plan view of the semiconductor package of FIG. 2A, with the cover omitted for purposes of illustration.
Figure 2C:
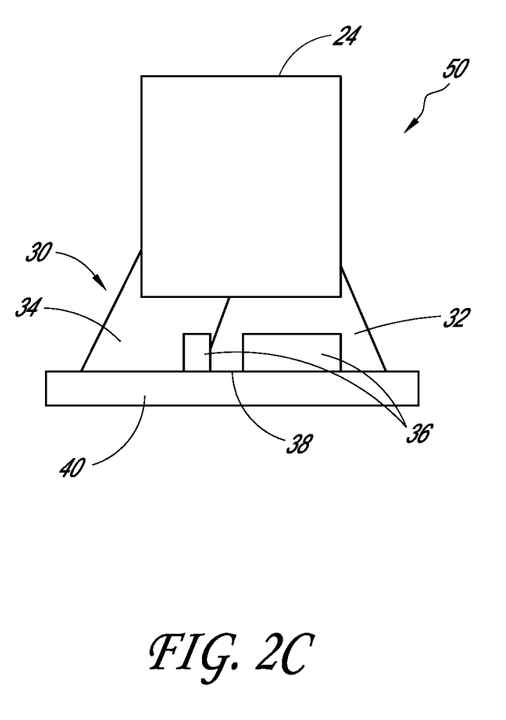
FIG. 2C is a magnified partial side sectional view of the package of FIG. 2A.

FIG. 2A is a schematic side cross-sectional view of a semiconductor package 10 with a seal 30 having an inner fillet 70, according to another embodiment. FIG. 2B is a magnified partial side sectional view of the package 10 of FIG. 2A, which illustrates the seal 30 including the inner fillet 70. FIG. 2C is a schematic top plan view of the semiconductor package of FIG. 2A, with the cover omitted for purposes of illustration. Unless otherwise noted, reference numerals in FIGS. 2A-2C refer to components that are the same as or generally similar to the components of FIGS. 1A-1C. The package 10 of FIGS. 2A-2C is generally similar to the package 10 shown in FIGS. 1A-1C, except the seal 30 in FIGS. 2A-2C includes an inner fillet 70 in addition to the outer fillet 72. For example, as with the outer fillet 72, the first adhesive layer 32 can additionally be disposed proximate the wall 24 such that it extends into the cavity 50 and forms an inner fillet 70 around an inner side surface 76 of the wall 24. This inner fillet 70 may or may not contact the inner side surface 76 of the wall 24. As shown in FIGS. 2A-2C, the inner and outer fillets 70, 72 can contact the respective side surfaces 76, 74 of the wall 24, which can advantageously contribute additional structural support to the interface between the lid 20 and substrate 40. Thus, in various embodiments, a portion of the first and second adhesive layers 32, 34 can be disposed proximate to, adjacent to, and/or under the wall 24. In addition, in the embodiments shown in FIGS. 1A-2C, the second adhesive layer 34 can be disposed around an outer perimeter of the first adhesive layer 32 such that the first adhesive layer 32 is not exposed to the environment outside of the cavity 50.

Figure 3:
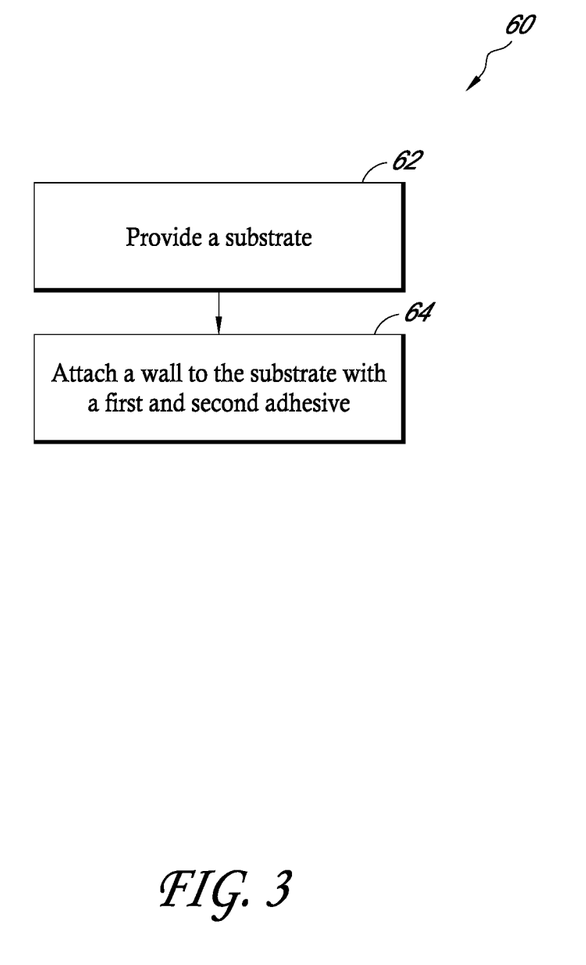
FIG. 3 is a flowchart illustrating a method for manufacturing a semiconductor package with a seal having at least two adhesives, in accordance with various embodiments.

In addition, any of the embodiments described herein, any variations of the embodiments described herein, and/or any combinations of the features described herein can be manufactured with any suitable manufacturing method. For example, FIG. 3 is a flowchart illustrating a method 60 for manufacturing the semiconductor packages 10 shown in FIGS. 1A-1C and 2A-2C, according to various embodiments. In various embodiments, the method 60 can include any number of the following steps, and in any suitable order.

The method 60 illustrated in FIG. 3 can begin at a block 62 with providing a substrate. As described above, in certain embodiments, the substrate can comprise any suitable type of substrate, such as a flexible substrate, a PCB, a leadframe, a ceramic substrate, or a plastic substrate. The process 60 continues in a block 64, with attaching a wall to the substrate by way of a first and second adhesive, such as, for example, by way of the first and second adhesive layers 32, 34 described above. The wall may comprise a portion of a lid, such as a lid shaped to define a concavity. In some embodiments, the first adhesive layer 32 can comprise an epoxy (such as a conductive epoxy) and the second adhesive layer 34 can comprise solder. In other embodiments, both the first and second adhesive layers 32, 34 can comprise epoxies. Of course, any suitable manufacturing process with any number of steps in a similar or dissimilar order may be suitable. For example, before attaching the wall to the substrate, one or more integrated device dies can be mounted and electrically connected to the substrate. The lid can be electrically connected to ground to provide RF shielding capabilities.

Any system, method, and device described in this application can include any combination of the preceding features described in this and other paragraphs, among other features and combinations described herein, including features and combinations described in subsequent paragraphs.

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow. Moreover, language such as "up to," "at least," "greater than," "less than," "between," and the like includes the number recited. Numbers preceded by a term such as "approximately", "about", and "substantially" as used herein include the recited numbers (e.g., about 10% =10%), and also represent an amount close to the stated amount that still performs a desired function or achieves a desired result. For example, the terms "approximately", "about", and "substantially" may refer to an amount that is within less than 10% of, within less than 5% of, within less than 1% of, within less than 0.1% of, and within less than 0.01% of the stated amount.

We claim:

1. A semiconductor package comprising:
a substrate;
a wall attached to the substrate;
a first electrically conductive adhesive layer comprising a first epoxy comprising a conductive filler disposed between a bottom surface of the wall and a top surface of the substrate; and
a second adhesive layer comprising a second epoxy different from the first epoxy, the second epoxy disposed around an outer perimeter of the first adhesive layer, the second adhesive layer disposed adjacent and contacting the wall, the second adhesive layer comprising a material that is different from the first adhesive layer,
wherein at least one of the first adhesive layer and the second adhesive layer connects the wall to electrical ground by way of connection to one or more ground bond pads on the substrate.

2. The semiconductor package of claim 1, further comprising a lid comprising the wall and a cover portion integrally formed with the wall, and an integrated device die mounted to the package substrate within a cavity defined by the semiconductor package.

3. The semiconductor package of claim 1, wherein the integrated device die comprises a gallium arsenide (GaAs) die, a gallium nitride (GaN) die, or a Group III-V semiconductor die.

4. The semiconductor device of claim 1, wherein the second adhesive layer is a closed annulus surrounding the outer perimeter of the first adhesive layer.

5. The semiconductor package of claim 1, wherein the first adhesive layer is denser than the second adhesive layer.

6. The semiconductor package of claim 1, further comprising a solder mask dam positioned on the substrate proximate the wall,
wherein a portion of the first or second adhesive layer is adhered to the solder mask dam,
wherein the solder mask dam comprises a first portion adjacent a second portion, the first and second portions separated by a gap,
wherein the gap exposes a portion of the substrate, and
wherein the first or second adhesive layer is electrically grounded via connection to one or more ground bond pads comprising conductive traces of the substrate exposed in the gap.

7. The semiconductor package of claim 1, wherein the first adhesive layer and the second adhesive layer form a seal that seals the wall to the substrate, wherein the seal is configured to withstand standard temperature humidity bias (THB) testing at 85 degrees Celsius and 85 percent humidity in the range of 1000 hours to 3000 hours.

8. The semiconductor package of claim 1, wherein the material of the second adhesive layer is more effective at inhibiting moisture from permeating into the package from the outside environs than the first adhesive layer.

9. A semiconductor package comprising:
a substrate;
a wall attached to the substrate;
a first epoxy layer disposed between a bottom surface of the wall and a top surface of the substrate; and
a second epoxy layer disposed around an outer perimeter of the first epoxy layer, the second epoxy layer disposed adjacent and contacting the wall,
wherein the first epoxy layer comprises an epoxy comprising a material different from the second epoxy layer, the first epoxy layer comprising a conductive filler.

10. The semiconductor package of claim 9, further comprising a lid comprising the wall and a cover portion integrally formed with the wall, and an integrated device die mounted to the package substrate within a cavity defined by the semiconductor package,
wherein the integrated device die comprises a gallium arsenide (GaAs) die, a gallium nitride (GaN) die, or a Group semiconductor die.

11. The semiconductor package of claim 9, wherein at least a portion of the second epoxy layer is disposed between the bottom surface of the wall and the top surface of the substrate.

12. The semiconductor package of claim 9, wherein the first epoxy layer comprises a silver or copper filled epoxy and the second epoxy layer comprises a non-conductive epoxy.

13. The semiconductor package of claim 9, wherein the second epoxy layer contacts the first epoxy layer about the outer perimeter.

14. The semiconductor package of claim 9, wherein the second epoxy layer is a closed annulus surrounding the outer perimeter of the first epoxy layer, and wherein the second epoxy layer contacts the first epoxy layer between a bottom surface of the wall and a top surface of the substrate.

15. The semiconductor package of claim 9, wherein the first or second epoxy layer connects the wall to electrical ground by way of connection to one or more ground bond pads on the substrate.

16. The semiconductor package of claim 9, wherein the second epoxy layer contacts the first epoxy layer between a bottom surface of the wall and a top surface of the substrate.

17. The semiconductor package of claim 9, wherein the first epoxy layer and the second epoxy layer form a seal that seals the wall to the substrate, wherein the seal is configured to withstand standard temperature humidity bias (THB) testing at 85 degrees Celsius and 85 percent humidity in the range of 1000 hours to 3000 hours.

18. A semiconductor package comprising:
a substrate;
a wall attached to the substrate;
an epoxy layer disposed between a bottom surface of the wall and a top surface of the substrate, the epoxy comprising a conductive filler; and
a solder layer disposed around an outer perimeter of the epoxy layer, the solder layer disposed adjacent and contacting the wall,
a solder mask dam positioned on the substrate proximate the wall, wherein the epoxy or solder layer connects the wall to electrical ground by way of connection to one or more ground bond pads on the substrate, wherein a portion of the epoxy and solder layer is adhered to the solder mask dam, wherein the solder mask dam comprises a first portion adjacent a second portion, the first and second portions separated by a gap, wherein the gap exposes a portion of the substrate, and wherein the epoxy or solder layer is electrically grounded via connection to one or more ground bond pads comprising conductive traces of the substrate exposed in the gap.

19. The semiconductor package of claim 18, further comprising a lid comprising the wall and a cover portion integrally formed with the wall, and an integrated device die mounted to the package substrate within a cavity defined by the semiconductor package, wherein the integrated device die comprises a gallium arsenide (GaAs) die, a gallium nitride (GaN) die, or a Group semiconductor die.

\* \* \* \* \*